(12) United States Patent
Schofield et al.

(10) Patent No.: US 6,236,346 B1
(45) Date of Patent: *May 22, 2001

(54) CELL ARRAY CIRCUITRY

(75) Inventors: William George John Schofield, Binfield; Ian Juso Dedic, Northolt, both of (GB)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,837

(22) Filed: Aug. 21, 1998

(30) Foreign Application Priority Data

Jan. 8, 1998 (GB) .................................................. 9800367

(51) Int. Cl.$^7$ ..................................................... H03M 1/66

(52) U.S. Cl. .......................................... 341/144; 341/153

(58) Field of Search ................................. 341/144, 145, 341/136, 135, 153

(56) References Cited

U.S. PATENT DOCUMENTS

| | | | |
|---|---|---|---|
| 3,995,304 | * 11/1976 | Pease | 341/144 |
| 4,658,240 | * 4/1987 | Bixby | 341/118 |
| 4,695,826 | * 9/1987 | Ando et al. | 341/118 |
| 4,812,818 | * 3/1989 | Colles | 341/118 |

(List continued on next page.)

FOREIGN PATENT DOCUMENTS 0 280 277  8/1988 (EP) .
2 230 909  10/1990 (GB) .

OTHER PUBLICATIONS

Nakamura, Yasuyuki et al., "A 10–b 70–MS/S CMOS D/A Converter", IEEE Journal of Solid State Circuits. vol. 26, No. 4, Apr. 1991, pp. 637–642.

Fotouhi, Bahram et al., "High–Resolution A/D Conversion in MOS/LSI", IEEE Journal of Solid–State Circuits, vol. SC–14, No. 6 Dec. 1979, pp. 920–926.

Agostini, Franco, "Math and Logic Games" (Extract), Facts on File, Inc., 1983, ISBN 0–87196–212–8, pp. 42–48.

Razavi, Behzad, "Principles of Data Conversion System Design" (Extract), IEEE Press, 1995, ISBN 0–7803–1093–4, pp. 142–147.

Razavi, Behzad, "Principles of Data Conversion System Design" Extract, IEEE Press, 1995, ISBN 0–7803–1093–4, pp. 90–94.

*Primary Examiner*—Michael Tokar
*Assistant Examiner*—Peguy JeanPierre
(74) *Attorney, Agent, or Firm*—Staas & Halsey LLP

(57) ABSTRACT

Cell array circuitry (20) includes a cell array (22) made up of a plurality of current-source cells (2) arranged in rows and columns. The cells of the array are assigned respective ordinal positions in a predetermined selection sequence conforming, for example, to a so-called "magic square". The assigned ordinal positions are such as to tend to equalise the respective sequence-position sums for different rows of the array and/or to tend to equalise the respective sequence-position sums for different columns of the array, where the sequence-position sum for a row or column is determined by summing the respective ordinal positions of the cells in the row or column concerned. Switch circuits ($4_1$ to $4_{16}$) select those cells whose assigned ordinal positions are less than an applied value (e.g. 3). Respective currents produced by the selected cells are accumulated as an output current ($I_A$) on a summing path (A). In such cell array circuitry the effects of graded and symmetrical errors within the cell array are reduced. Such cell array circuitry is suitable for use, for example, in a digital-to-analog converter (FIG. 5). Other embodiments (FIGS. 19–24) relate to the use of plural cell arrays to reduce the effects of such errors.

39 Claims, 16 Drawing Sheets

U.S. PATENT DOCUMENTS

| | | | |
|---|---|---|---|
| 4,859,930 | * 8/1989 | Schouwenaars | 341/133 |
| 4,875,046 | * 10/1989 | Lewyn | 341/148 |
| 5,057,838 | * 10/1991 | Tsuji et al. | 341/133 |
| 5,568,145 | 10/1996 | Reynolds | 341/145 |
| 5,892,471 | * 4/1999 | Mahant-Shetti et al. | 341/135 |
| 5,977,897 | * 11/1999 | Barnes et al. | 341/144 |

* cited by examiner

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

|  | x | y | Σx | Σy | E=Σx+Σy |
|---|---|---|---|---|---|
| 1 | -2 | -2 | -2 | -2 | -4 |
| 2 | +1 | +2 | -1 | 0 | -1 |
| 3 | -1 | +2 | -2 | +2 | 0 |
| 4 | +2 | -2 | 0 | 0 | 0 |
| 5 | +2 | +1 | +2 | +1 | +3 |
| 6 | -1 | -1 | +1 | 0 | +1 |
| 7 | +1 | -1 | +2 | -1 | +1 |
| 8 | -2 | +1 | 0 | 0 | 0 |
| 9 | +2 | -1 | +2 | -1 | -1 |
| 10 | -1 | +1 | +1 | 0 | +1 |
| 11 | +1 | +1 | +2 | +1 | +3 |
| 12 | -2 | -1 | 0 | 0 | 0 |
| 13 | -2 | +2 | -2 | +2 | 0 |
| 14 | +1 | -2 | -1 | 0 | -1 |
| 15 | -1 | -2 | -2 | -2 | -4 |
| 16 | +2 | +2 | 0 | 0 | 0 |

FIG. 6

|    | x  | y  | Σx | Σy  | E   |
|----|----|----|----|-----|-----|
| 1  | -2 | -2 | -2 | -2  | -4  |
| 2  | -1 | -2 | -3 | -4  | -7  |
| 3  | +1 | -2 | -2 | -6  | -8  |
| 4  | +2 | -2 | 0  | -8  | -8  |
| 5  | -2 | -1 | -2 | -9  | -11 |
| 6  | -1 | -1 | -3 | -10 | -13 |
| 7  | +1 | -1 | -2 | -11 | -13 |
| 8  | +2 | -1 | 0  | -12 | -12 |
| 9  | -2 | +1 | -2 | -11 | -13 |
| 10 | -1 | +1 | -3 | -10 | -11 |
| 11 | +1 | +1 | -2 | -9  | -13 |
| 12 | +2 | +1 | 0  | -8  | -8  |
| 13 | -2 | +2 | -2 | -6  | -8  |
| 14 | -1 | +2 | -3 | -2  | -4  |
| 15 | +1 | +2 | -2 | -2  | -4  |
| 16 | +2 | +2 | 0  | 0   | 0   |

|   |   |   |
|---|---|---|
| 6 | 1 | 8 |
| 7 | 5 | 3 |
| 2 | 9 | 4 |

FIG. 9(C)

|   |   |   |
|---|---|---|
| 8 | 3 | 4 |
| 1 | 5 | 9 |
| 6 | 7 | 2 |

FIG. 9(D)

|   |   |   |
|---|---|---|
| 2 | 9 | 4 |
| 7 | 5 | 3 |
| 6 | 1 | 8 |

FIG. 9(E)

|   |   |   |
|---|---|---|
| 8 | 1 | 6 |
| 3 | 5 | 7 |
| 4 | 9 | 2 |

FIG. 9(F)

|   |   |   |
|---|---|---|
| 4 | 3 | 8 |
| 9 | 5 | 1 |
| 2 | 7 | 6 |

FIG. 9(G)

|   |   |   |
|---|---|---|
| 6 | 7 | 2 |
| 1 | 5 | 9 |
| 8 | 3 | 4 |

FIG. 9(H)

| 7 | 12 | 1 | 14 |
|---|----|---|----|
| 2 | 13 | 8 | 11 |
| 16 | 3 | 10 | 5 |
| 9 | 6 | 15 | 4 |

FIG. 10

| 4 | 15 | 6 | 9 |
|---|----|---|---|
| 5 | 10 | 3 | 16 |
| 11 | 8 | 13 | 2 |
| 14 | 1 | 12 | 7 |

FIG. 11

| b | c | a |   |
|---|---|---|---|
| c | a |   | b |
| a |   | b | c |
|   | b | c | a |

FIG. 12(A)

|   | d | f | e |
|---|---|---|---|
| e |   | d | f |
| f | e |   | d |
| d | f | e |   |

FIG. 12(B)

|   |   |   |   |   |
|---|---|---|---|---|
| 1 | 15 | 24 | 8 | 17 |
| 23 | 7 | 16 | 5 | 14 |
| 20 | 4 | 13 | 22 | 6 |
| 12 | 21 | 10 | 19 | 3 |
| 9 | 18 | 2 | 11 | 25 |

FIG. 13(A)

|   |   |   |   |   |   |
|---|---|---|---|---|---|
| 27 | 29 | 2 | 4 | 13 | 36 |
| 9 | 11 | 20 | 22 | 31 | 18 |
| 32 | 25 | 7 | 3 | 21 | 23 |
| 14 | 16 | 34 | 30 | 12 | 5 |
| 28 | 6 | 15 | 17 | 26 | 19 |
| 1 | 24 | 33 | 35 | 8 | 10 |

FIG. 13(B)

|   |   |   |   |   |   |   |   |
|---|---|---|---|---|---|---|---|
| 64 | 2 | 3 | 61 | 60 | 6 | 7 | 57 |
| 9 | 55 | 54 | 12 | 13 | 51 | 50 | 16 |
| 17 | 47 | 46 | 20 | 21 | 43 | 42 | 24 |
| 40 | 26 | 27 | 37 | 36 | 30 | 31 | 33 |
| 32 | 34 | 35 | 29 | 28 | 38 | 39 | 25 |
| 41 | 23 | 22 | 44 | 45 | 19 | 18 | 48 |
| 49 | 15 | 14 | 52 | 53 | 11 | 10 | 56 |
| 8 | 58 | 59 | 5 | 4 | 62 | 63 | 1 |

FIG. 13(C)

CELL ARRAY CIRCUITRY

CROSS REFERENCE TO RELATED APPLICATIONS

The subject application is related to the following U.S. and respective foreign priority applications:

DIFFERENTIAL SWITCHING CIRCUITRY filed concurrently and claiming priority from Great Britain application No. 9800387.4 filed Jan. 8, 1998 assigned to Fujitsu Microelectronics Limited;

THERMOMETER CODING CIRCUITRY filed concurrently and claiming priority from Great Britain application No. 9800384.1 filed Jan. 8, 1998 assigned to Fujitsu Microelectronics Limited;

ELECTROSTATIC DISCHARGE PROTECTION IN SEMICONDUCTOR DEVICES filed concurrently and claiming priority from Great Britain application No. 9804588.3 filed Mar. 4, 1998 assigned to Fujitsu Limited; and MIXED-SIGNAL CIRCUITRY AND INTEGRATED CIRCUIT DEVICES filed concurrently and claiming priority from Great Britain application No. 9804587.5 filed Mar. 4, 1998 assigned to Fujitsu Limited.

BACKGROUND OF THE INVENTION

1. Field of the Invention

The present invention relates to cell array circuitry for use, for example, in digital-to-analog converters (DACs).

2. Description of the Related Art

FIG. 1 of the accompanying drawings shows parts of a conventional digital-to-analog converter (DAC) of the so-called "current-steering" type. The DAC 1 is designed to convert an m-bit digital input word (D1–Dm) into a corresponding analog output signal.

The DAC 1 includes a plurality (n) of identical current sources $2_1$ to $2_n$ where $n=2^m-1$. Each current source 2 passes a substantially constant current I. The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by a binary-thermometer decoder 6. The decoder 6 operates as follows.

When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n–i differential switching circuits $4_{i+1}$ to $4_n$ select their respective second terminals. The analog output signal $V_A-V_B$ is equal to (2i–n)IR.

FIG. 2 shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr–1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

It will be appreciated that the number of current sources 2 and corresponding differential switching circuits 4 in the FIG. 1 architecture is quite large, particularly when m is greater than or equal to 6. When m=6, for example, n=63, and 63 current sources and 63 differential switching circuits are required. In order to deal with such a large number of current sources, and to enable the thermometer signals to be delivered efficiently to the different differential switching circuits, it has been proposed to arrange the current sources and differential switching circuits as a two-dimensional array of cells, each cell including one current source and its associated differential switching circuit. This arrangement is shown in FIG. 3.

In FIG. 3, 64 cells $CL_{ij}$ are arranged in an 8×8 square array having eight rows and eight columns. In FIG. 3, the first digit of the suffix applied to each cell denotes the row in which the cell is located and the second digit of the suffix denotes the column in which the cell is located. Thus, the cell $CL_{18}$ is the cell in row 1, column 8.

Each cell $CL_{ij}$ includes its own current source 2 and its own differential switching circuit 4. The respective first terminals of the cells of the array are connected together to a first connection line A of the DAC and the respective second terminals of the cells of the array are connected together to a second connection line B of the DAC, as in the FIG. 1 DAC.

In order to avoid having to generate and supply different respective thermometer-coded signals to all the cells of the array, a two-stage decoding process is adopted to convert the binary input word D1–D6 into the respective thermometer-coded control signals T required by the differential switching circuits 4 in the different cells. The first stage of this two-stage decoding process is carried out by respective row and column decoders 12 and 14, and the second stage is carried out by a local decoder 16 provided for each cell.

The three lower-order bits D1–D3 of the binary input word are applied to the column decoder 14 which derives therefrom seven thermometer-coded column selection signals in accordance with FIG. 2. The row decoder 12 receives the three higher-order bits D4–D6 of the input word and derives therefrom seven thermometer-coded row selection signals, also in accordance with FIG. 2. The row and column selection signals are distributed to the cells of the array.

In each cell the local decoder 16 combines the row and column selection signals to derive therefrom the required local control signal T for the differential switching circuit 4 of the cell concerned. In practice, the local decoder 16 in each cell does not need to employ all seven row and column selection signals to produce the required local control signal T. This is because, for any digital input word, the rows of the matrix fall into one of three different states: (1) rows in which the respective differential switching circuits of all cells of the row select the second terminal; (2) rows in which the respective differential switching circuits of all cells of the row select the first terminal; and (3) a (unique) row in which the differential switching circuits of one or more cells of the row select the second terminal whereas the differential switching circuits of one or more other cells of the row select the first terminal. In view of these limited possibilities, it is possible for each local decoder to derive its local control signal T simply by combining two of the row selection signals $r_n$ and $r_{n+1}$ and one of the column selection signals $c_n$.

The numbers allotted to the cells $CL_{ij}$ in FIG. 3 denote the sequence in which the cells are activated (or controlled) to change from selecting their respective second terminals to selecting their respective first terminals. The activation sequence follows the physical order of the cells in the array, starting from row 1 and activating the cells of that row sequentially in column order, followed by row 2, and so on for each successive row of the array.

One problem which arises in the FIG. 3 arrangement is that, although the output currents of the respective current sources 2 of the different cells of the array should be uniform, in practice the actual output currents of the cells suffer from non-uniformity arising from various causes.

For example, a voltage drop along a power supply line can cause a graded error along a row or column, as shown in FIG. 4(A). In this case, the current sources in the first four cells of the row or column concerned may have negative errors, signifying that each of them produces a below-average output current. These negative errors decrease towards the centre of the row or column concerned. The current sources in the remaining cells 5 to 8 of the row or column concerned have respective positive errors, signifying that each of them produces an above-average output current. These positive errors increase from the centre of the row or column to the end.

Thermal distribution inside a chip including the array can cause a symmetrical error within a row or column, as shown in FIG. 4(B). In this case, the current sources in the end cells 1, 2, 7 and 8 of the row or column have negative errors, whereas the current sources of the central cells 3 to 6 of the row or column have positive errors.

In addition, there can be other types of error such as random errors. The final error distribution for the cell array is produced by superposing all the different error components.

The graded and symmetrical errors shown in FIG. 4(A) and FIG. 4(B) tend to accumulate and result in a large integral linearity error (INL). For example, imagine that the graded error distribution shown in FIG. 4(A) exists within the first row of the cell array shown in FIG. 3. In this case, as cells 1 to 4 are progressively activated (changed from selecting their respective second terminals to selecting their respective first terminals) the negative errors accumulate, amounting to a significant total negative error when the digital input code is 4. Only when cells 5 to 8 are sequentially activated do the positive errors attributable to these cells start to cancel out the large negative error attributable to cells 1 to 4.

Of course the situation is even worse if there are graded errors corresponding to FIG. 4(A) along each of the columns 1 to 8. In this case, as cells 1 to 8 are progressively activated, the largest negative error (the error at position 1 in FIG. 4(A)) occurs for each of the eight cells of row 1. Similarly, in row 2, negative errors corresponding to position 2 in FIG. 4(A) accumulate eight times. Thus, by the time the input code has increased to 32 (corresponding to all of the cells in rows 1 to 4 being activated) the accumulated negative error is very large indeed.

Similar problems arise with the accumulation of symmetrical errors of the kind shown in FIG. 4(B).

Heretofore various proposals have been made which attempt to address the problem of accumulation of graded and symmetrical errors within a row or column of a cell array. For example, IEEE Journal of Solid-State Circuits, Volume 26 No. 4, April 1991, pp. 637–642 discloses a technique referred to as "hierarchical symmetrical switching" for cancelling graded and symmetrical errors within a single row or column. However, such techniques do not provide a fully satisfactory way of dealing with the problem of accumulation of graded and symmetrical errors within different rows and columns of a cell array, i.e. two-dimensional cancellation.

SUMMARY OF THE INVENTION

According to a first aspect of the present invention there is provided cell array circuitry including: a cell array made up of a plurality of mutually-corresponding cells arranged in rows and columns; selection means for assigning the cells of the array respective ordinal positions in a predetermined selection sequence and for selecting the cells in accordance with their respective assigned ordinal positions, the assigned ordinal positions being such as to tend to equalise the respective sequence-position sums for different rows of the array and/or to tend to equalise the respective sequence-position sums for different columns of the array, where the sequence-position sum for a row or column is determined by summing the respective ordinal positions of the cells in the row or column concerned; and accumulation means for accumulating respective analog quantities produced by, or associated with, the selected cells.

In such cell array circuitry the effects of graded and symmetrical errors within the cell array are reduced.

The cells may include any suitable type of analog circuitry where matching between respective analog quantities produced by, or associated with, the different cells is required. For example, each cell may include a current source or current sink circuit, in which case the accumulation means may be operable to accumulate respective currents sourced, or sunk as the case may be, by the current source/sink circuits of the selected cells. Alternatively, each cell may include a capacitance element, in which case the accumulation means may be operable to accumulate respective charges stored by the capacitance elements of the selected cells. Alternatively, each cell may include a resistance element, in which case the accumulation means may be operable to accumulate respective resistances of the resistance elements of the selected cells.

The selection means may, for example, be operable to select together each cell of the array whose said assigned ordinal position is less than a given value.

For example, when the given value is i, the cells whose assigned ordinal positions are 1,2, . . . , i–1 are selected. It is convenient in this case if said given value is determined by a selection signal (a digital input word) applied to said selection means.

It is not necessary for the selection means to select the cells in this way, however. For example, said selection means could alternatively be operable to select the cells of the array in at least first and second binary-weighted groups, the number of cells in the first group being double the number of cells in the second group. This type of selection is suitable for use in a "charge distribution" ADC which requires binary-weighted capacitors. These binary-weighted capacitors can be formed by selecting binary-ratioed numbers (e.g. 1,2,4,8. . . ) of capacitor-cells from the cell array and connecting the selected cells in parallel with one another.

Preferably, in at least said first group the cells in the group have consecutive assigned ordinal positions. This helps to ensure that, within each group containing two or more cells, errors are cancelled.

It is useful if the assigned ordinal positions are preferably such as to tend to equalise the respective sequence-position sums for just some of the rows of the array and/or to tend to equalise the respective sequence-position sums for just some of the columns of the array. It is certainly not essential for every row to have the same sequence-position sum or for every column to have the same sequence-position sum.

Preferably, however, the assigned ordinal positions are such as to tend to equalise the respective sequence-position sums for all the rows of the array and/or to tend to equalise the respective sequence-position sums for all the columns of the array. This increases the effectiveness in overcoming the errors associated with the different cells.

When the cell array is square (i.e. has equal numbers of rows and columns), it is preferable that said assigned ordinal positions are such as to tend to equalise the respective sequence-position sums for all rows and columns of the array. This can be achieved, for example, by distributing said assigned ordinal positions within the array such that they conform to the distribution of integers in a magic square of order equal to the number of rows or columns of the array.

In some embodiments the magic square may be pandiagonal and/or associative. This may give additional error-compensating effects depending on the mode of selection of the cells.

When the cell array is rectangular (i.e. has different numbers of rows and columns), it is not necessary for the sequence-position sum(s) for the rows to be the same as the sequence-position sum(s) for the columns. Instead, said assigned ordinal positions are preferably such as to tend to equalise the respective sequence-position sums for all rows and to tend to equalise the respective sequence-position sums for all columns.

According to a second aspect of the present invention there is provided cell array circuitry including: respective first and second cell arrays, each cell array being made up of a plurality of mutually-corresponding cells arranged in rows and columns, the second cell array being placed in a predetermined spatial relationship with respect to the first cell array; cell set selection means for selecting the cells of the arrays in sets, each such cell set including a first cell from the first cell array and an individually-corresponding second cell from the second cell array, the physical arrangement of such second cells within the second cell array corresponding to a predetermined transformation of the physical arrangement of their respective corresponding first cells within the first cell array; and accumulation means for accumulating respective analog quantities produced by, or associated with, the first and second cells of a selected cell set.

In such cell array circuitry the effects of graded and/or symmetrical errors are reduced by virtue of the placement, in a predetermined arrangement, of an original cell array (the first cell array) and at least one "transformed" cell array (the second cell array) derived from the original cell array.

In one embodiment, suitable for cancelling out two sets of errors (e.g. a symmetrical error in one direction and a graded error in the perpendicular direction, or graded errors in each of two mutually-perpendicular directions, or symmetrical errors in each of two-mutually-perpendicular directions) the first and second cell arrays are spaced apart in a first direction, and a centreline of the second cell array that extends centrally through that array in the first direction is aligned with a centreline of the first cell array that extends centrally through that array in the first direction. In this case, said predetermined transformation may involve, for example, a reflection of said first cell array about its said centreline, or a rotation of the first cell array through 180°.

In another embodiment, suitable for cancelling graded errors in each of two-mutually-perpendicular directions, each cell array has a first half on one side of its said centreline and a second half on the other side of its said centreline, and said predetermined transformation involves copying the first half of the first cell array into the second half of the second cell array, and copying the second half of the first cell array into the first half of the second cell array.

Although the embodiments using two cell array are effective in overcoming two sets of errors, as outlined above, it is possible to use more arrays placed together to facilitate the cancellation of other combinations of graded and symmetrical errors in one or both mutually-perpendicular directions.

For example, the cell array circuitry may further include respective third and fourth such cell arrays, each made up of a plurality of mutually-corresponding cells arranged in rows and columns and each placed in a predetermined spatial relationship with respect to the first cell array. In this case, each said cell set selected by the cell set selection means further includes a third cell from the third cell array, which third cell corresponds individually to the first cell of the cell set concerned, and a fourth cell from the fourth cell array, which fourth cell corresponds individually to the first cell of the cell set concerned. Then, the physical arrangement of such third cells within the third cell array is made to correspond to a predetermined transformation of the physical arrangement of their respective corresponding first cells within the first cell array, and the physical arrangement of such fourth cells within the fourth cell array is made to correspond to a predetermined transformation of the physical arrangement of their respective corresponding first cells within the first cell array. In this case, the accumulation means should be operable to accumulate respective analog quantities produced by, or associated with, the first, second, third and fourth cells of a selected cell set.

For example, an area containing the four cell arrays may be considered to be divided into four quadrants by respective first and second mutually-perpendicular axes that intersect at an origin point of the area, the first, second, third and fourth cell arrays being arranged respectively in the four quadrants. The second, third and fourth cell arrays could simply be copies of the first cell array, which would enable symmetrical errors parallel to both axes to be cancelled.

However, in one preferred embodiment, first and second ones of the quadrants are on the same side of said second axis, and said first quadrant and a third one of the quadrants are on the same side of the first axis; the first cell array is located in said first quadrant; the second cell array corresponds to a reflection about said second axis of said first cell array, which reflection is located in said second quadrant; the third cell array corresponds to a reflection about said first axis of said first cell array, which reflection is located in said third quadrant; and the fourth cell array corresponds to a rotation through 180° of said first cell array, which rotation is located in said fourth quadrant.

The result of arranging the first, second, third and fourth cell arrays in such a configuration is that the corresponding cells of each cell set have a common centroid at the origin. In this case, both graded and symmetrical errors parallel to both axes are cancelled: a highly-desirable effect.

The cell set selection means may serve to assign the cells of each cell array respective ordinal positions in a predetermined selection sequence and to select the cells in accordance with their respective assigned ordinal positions, and said accumulation means may be operable to accumulate respective analog quantities (e.g. currents, capacitances, resistances etc.) produced by, or associated with, the cells of the selected cell sets.

For each cell array the assigned ordinal positions may simply conform to the physical order of the cells in the cell array concerned. Alternatively, the assigned ordinal positions may conform to those in the cell array circuitry embodying the aforesaid first aspect of the invention. In this case, all of the preferred features described above in relation to the first aspect may be included optionally to advantage in embodiments of the second aspect of the invention.

BRIEF DESCRIPTION OF THE DRAWINGS

FIG. 6 shows a table for use in explaining the effects of graded and symmetrical errors in the FIG. 5 embodiment;

FIG. 8 shows one example of a 3×3 magic square;

FIG. 9(A) is a schematic diagram for use in explaining how the FIG. 8 magic square can be transformed to produce further magic squares;

FIGS. 9(B) to 9(H) show respective magic squares produced by the transformations shown in FIG. 9(A);

FIGS. 10 and 11 show respective examples of 4×4 magic squares;

FIGS. 12(A) and 12(B) are schematic diagrams for use in explaining properties of the FIG. 10 magic square;

FIGS. 13(A), 13(B) and 13(C) show examples of 5×5, 6×6 and 8×8 magic squares respectively;

DETAILED DESCRIPTION OF THE PREFERRED EMBODIMENTS

Figure 5:
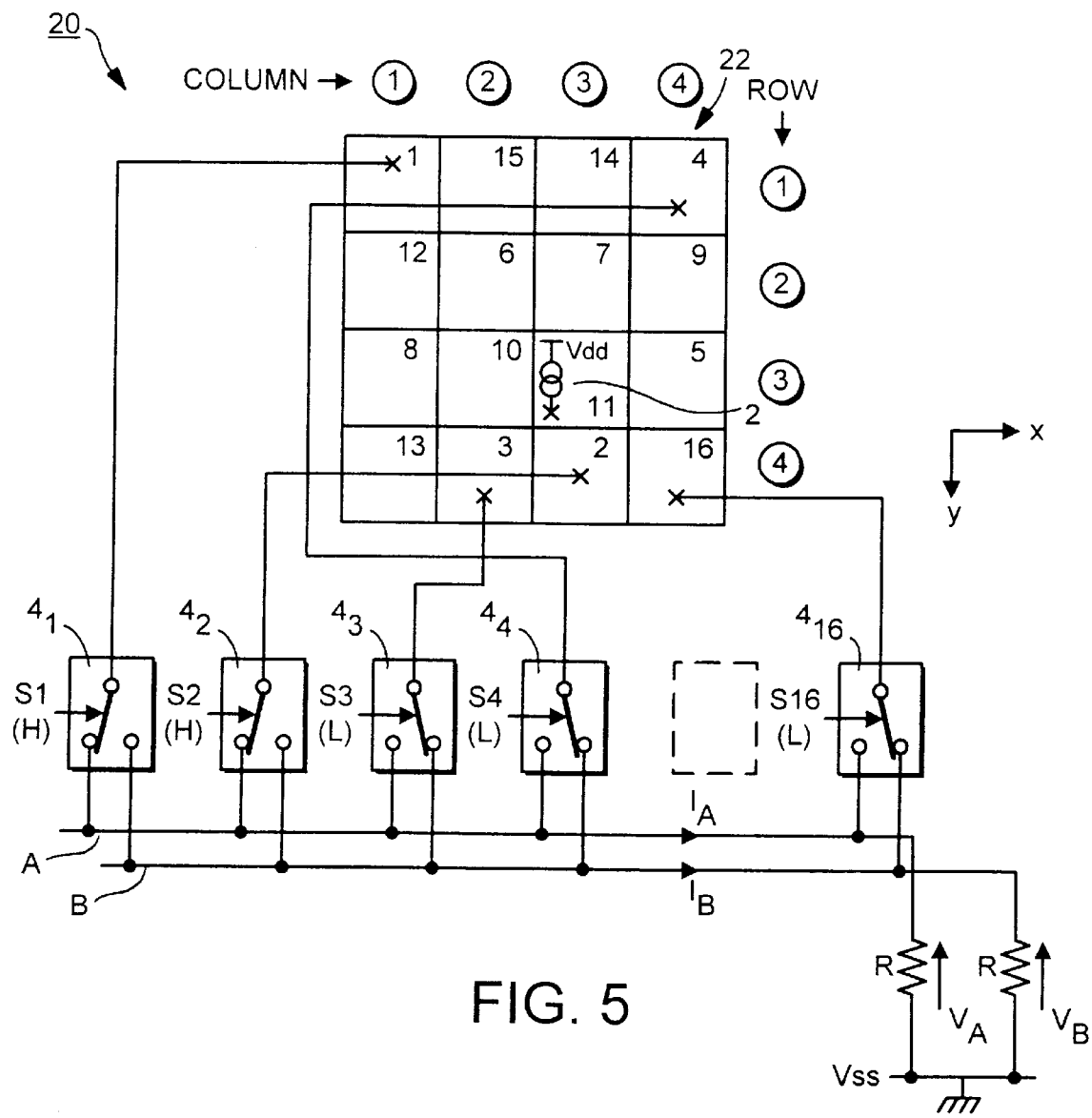
FIG. 5 shows cell array circuitry according to a first embodiment of the present invention.

FIG. 5 shows parts of cell array circuitry embodying the present invention. The FIG. 5 cell array circuitry 20 is suitable for use in a digital-to-analog converter of the current-steering type. In FIG. 5, components which correspond to components already described with reference to the DAC of FIG. 3 have the same reference numerals as used in FIG. 3.

The cell array circuitry 20 comprises a cell array 22 made up of 16 individual cells arrayed in four rows and four columns. Each cell comprises a current source 2, as shown schematically for the cell numbered 11 in FIG. 5. Each cell has an output node denoted by a cross within the cell in FIG. 5.

Each cell of the cell array 22 has an individually-corresponding switch circuit $4_1$ to $4_{16}$. In this embodiment, the switch circuits 4 are external to the cells and the output node of each cell is connected to an input node of its individually-corresponding switch circuit 4.

Each switch circuit has respective first and second terminals, the first terminal being connected to a first summing connection line A and the second terminal being connected to a second summing connection line B.

Figures 1, 2:
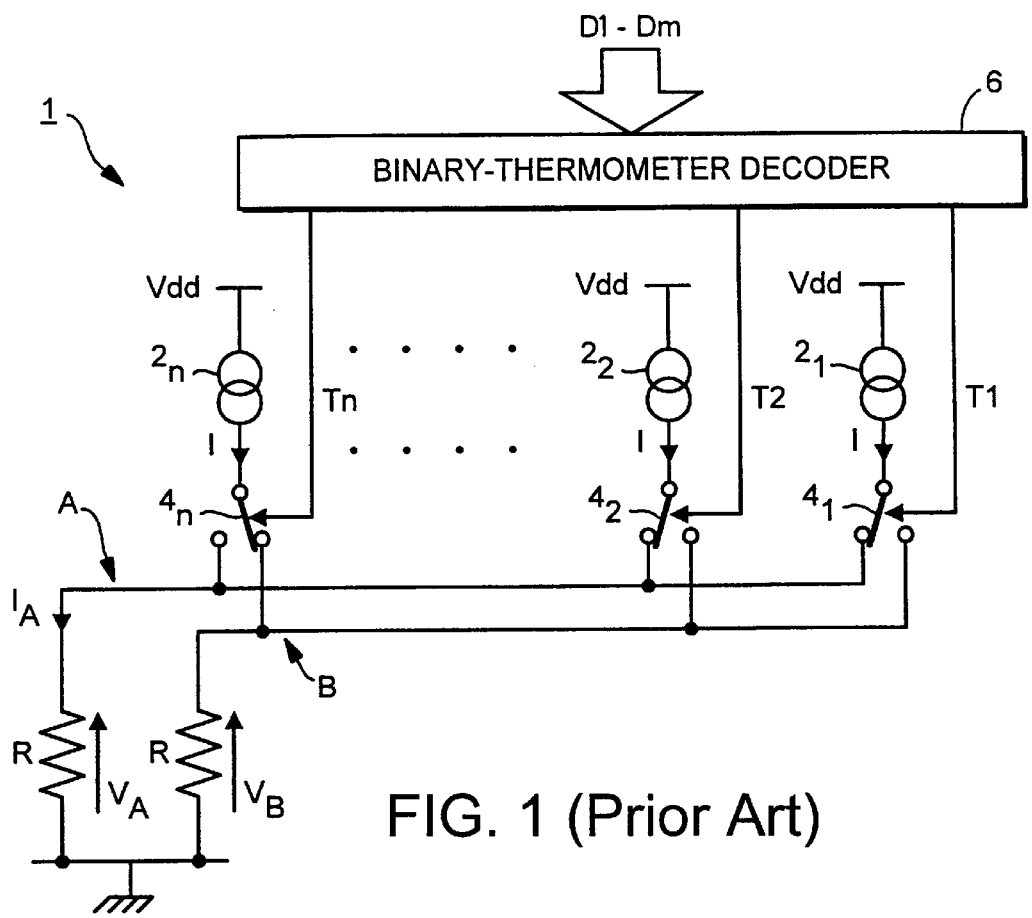
FIG. 1, discussed hereinbefore, shows parts of a previously-considered current-steering DAC.
FIG. 2, also discussed hereinbefore, shows a table for use in explaining how thermometer-coded control signals are derived from a binary input word in the FIG. 1 DAC.
Figure 3:
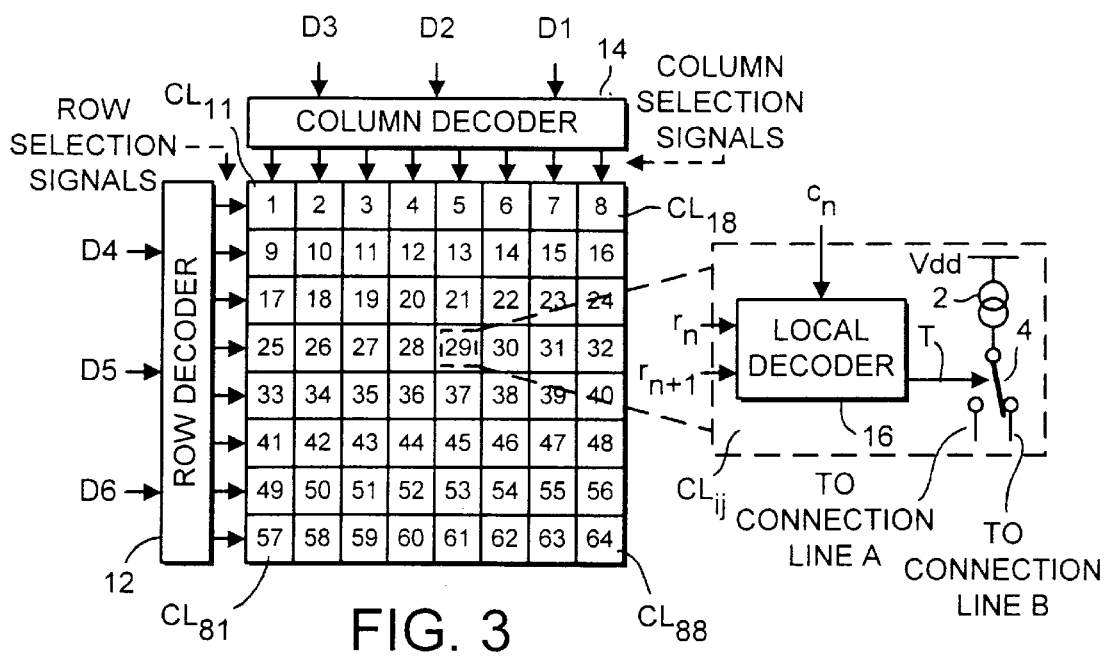
FIG. 3, also discussed hereinbefore, shows parts of cell array circuitry previously considered for use in a DAC.
Figure 4A:
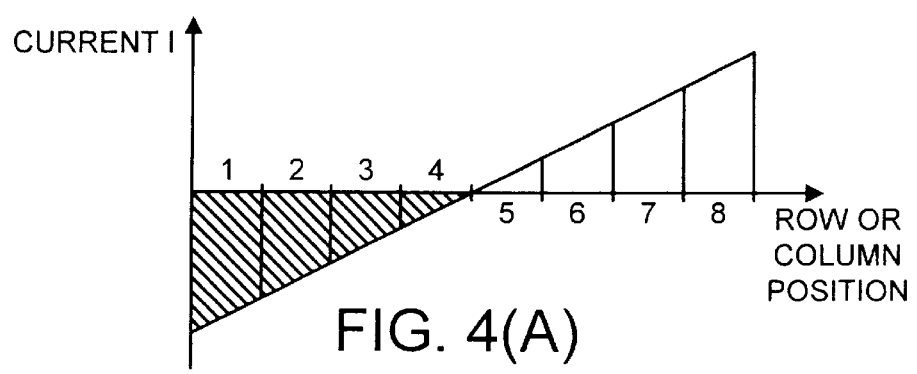
FIGS. 4(A) and 4(B), also discussed hereinbefore, are schematic diagrams for use in explaining the occurrence of graded and symmetrical errors in the cell array circuitry of FIG. 3.
Figure 4B:
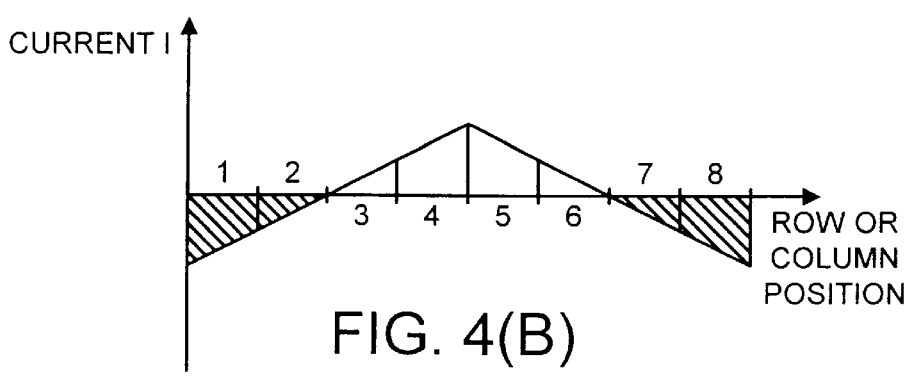

The switch circuits $4_1$ to $4_{16}$ receive respective thermometer-coded selection signals S1 to S16 from decoding circuitry of the DAC (not shown). This decoding circuitry may derive the selection signals S1 to S16 directly (in one stage) from a binary input word of the DAC (as shown schematically in FIG. 1) or in two stages using respective row and column decoders to perform the first stage of the decoding and using local decoders corresponding respectively to the cells to perform the second stage of the decoding (as shown in FIG. 3).

Each switch circuit selects its second output terminal when the selection signals applied to it has the low logic level L and selects its first output terminal when the selection signal S applied to it has the high logic level H. As shown in FIG. 5 itself, the selection signals S1 and S2 are both H, whereas the remaining selection signals S3 to S16 are L. Thus, the switch circuits $4_1$ and $4_2$ have selected their respective first terminals, whereas the remaining switch circuits are selecting their respective second terminals.

The cells in the cell array 22 of FIG. 5 are selected in a sequence different from the conventional selection sequence described above with reference to FIG. 3. In particular, the selection sequence in this embodiment is such that, for each row, column and diagonal of the cell array 22, the sum of the respective selection-sequence positions of the cells is the same (in this case 34). Thus, for example, taking row 1 as one example, the respective selection-sequence positions 1, 15, 14 and 4 add up to 34. Similarly, the respective selection-sequence positions 1, 12, 8 and 13 of the cells of column 1 also add up to 34. Along the diagonal from the top left to the bottom right, the respective selection-sequence positions of the cells are 1, 6, 11 and 16 which again add up to 34.

To understand the advantageous effect of the particular cell array layout shown in FIG. 5, consider the table shown in FIG. 6. In FIG. 6, it is assumed that graded errors exist in both the row-direction (x-direction) and the column-direction (y-direction). The error for position 1 of each row or column is assumed to be −2 (units), the error for position 2 of each row 2 or column is assumed to be −1, the error for position 3 of each row or column is assumed to be +1, and the error for position 4 of each row or column is assumed to be +2.

In FIG. 6, the table shows the x-error and y-error for each ordinal position in the selection sequence of the cells. For those cells that are selected at the same time in response to a given input code, the respective x-errors sum to produce a total x-error Σx, and the respective y-errors sum to produce a total y-error Σy. As is apparent from FIG. 6, the total x-error Σx varies in a small range from −2 to +2, as does the total y-error Σy. The total error E (which the sum of the total x-error Σx and the total y-error Σy) varies within a narrow range from −4 to +3.

Figures 7A, 7B:
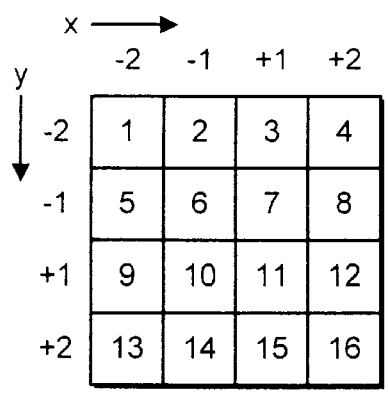
FIG. 7(A) shows, for comparison with the table of FIG. 6, a table showing the effects of graded and symmetrical errors in cell array circuitry not embodying the present invention.
FIG. 7(B) shows an example of conventional cell array circuitry.

By way of comparison, FIG. 7(A) shows the error values and accumulations in the case in which the selection sequence in the cell array is as shown in FIG. 7(B). In this case, it can be seen that the total x-error Σx, the total y-error Σy and the total error E each vary in greater ranges than the corresponding total errors in FIG. 6. In particular the total y-error Σy is consistently negative and reaches −12 in the worst case. Furthermore, the total x-error Σx, although relatively small compared to the total y-error Σy, is also consistently negative and so has the effect of increasing the total error E for every input code.

Similar advantages are obtained in relation to symmetrical and other errors in the cells of the cell array 22 in FIG. 5.

It may be appreciated by mathematicians that the ordinal positions in the selection sequence of the cells in the cell array 22 shown in FIG. 5 correspond to the order of integers in a so-called magic square. Such a magic square contains the integers from 1 to $n^2$, without repetition, in such a way that each row (left to right) and column (top to bottom) and the two diagonals have the same sum. The number n is called the order, base, module or root of the square. It is not yet known what mathematical law governs the disposition of numbers in magic squares. Known solutions have only been discovered by trial and error.

There is no magic square of order 2. A magic square of order 3 is shown in FIG. 8.

Figures 8, 9A, 9B:
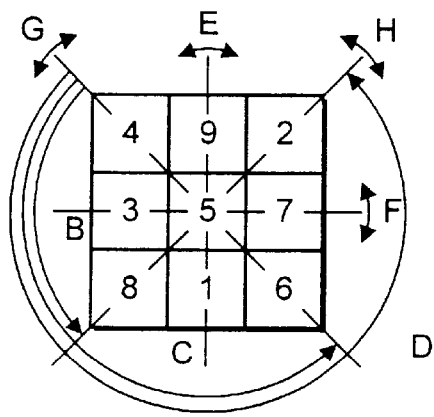

It will be appreciated that it is possible to produce other magic squares of order 3 by transforming the magic square shown in FIG. 8, as shown in FIGS. 9(A) to 9(H). In these figures, FIG. 9(A) shows, as a starting point, the magic square of FIG. 8. FIG. 9(B) shows the effect of rotating the magic square of FIG. 9(A) anticlockwise through 90°, as denoted by the arrow labelled B in FIG. 9(A). FIGS. 9(C) and (D) relate respectively to anticlockwise rotations of 180 and 270°, as denoted by the arrows C and D in FIG. 9(A). FIGS. 9(E) to (H) show the effect of reflecting the magic square of FIG. 9(A) about various axes E to H. Further magic squares can be obtained by using combinations of the basic rotations and reflections shown in FIGS. 9(B) to 9(H).

Excluding rotations and reflections, there exists a unique magic square of order 3. However, with higher orders, the number of arrangements (excluding rotations and reflections) increases. A fourth-order square (i.e. four rows and four columns) has 880 different possible placings of its 16 numbers, excluding reflections and rotations. The numbers in each of the rows, columns and diagonals of the fourth-order square add up to 34.

For higher-order squares (fifth-order and above) the number of different possible placings increases dramatically. For example, a fifth-order square has 275,305,224 different placings, excluding rotations and reflections.

In the case of a square of order 4, FIGS. 10 and 11 show two alternative possibilities, each different from the arrangement shown in FIG. 5. The arrangement shown in FIG. 11 is referred to as a "pandiagonal" magic square since the sum of the four central squares is 13+8+3+10=34, as is the sum of the four corners (7+14+9+4=34) and the 4 off-diagonal squares (e.g. the top-left square: 7+12+2+13=34). Furthermore, as shown in FIGS. 12(A) and 12(B) the same sum, 34, is obtained by adding the numbers at the four positions a, the numbers at the four positions b, or the numbers at the four positions c in FIG. 12 (A) or the numbers at the four positions d, or the numbers at the four positions e, or the numbers at the four positions f in FIG. 12(B).

Examples of fifth-,sixth- and eighth- order magic squares are shown in FIGS. 13(A), 13(B) and 13(C) respectively. For the fifth-order magic square, the sum of the rows, columns and the two diagonals is 65, for the sixth-order magic square it is 111 and for the eighth-order magic square it is 260.

Referring to FIG. 13(A), it can be seen that any pair of numbers opposite the centre (e.g. 7 and 19; 20 and 6; 1 and 25) adds up to $n^2+1$ (the order n being 5 in this case). Such a magic square is called "associative". The third-order magic square shown in FIG. 8 also has this property and is therefore associative. A fourth-order square may be either associative or pandiagonal but not both. The smallest square that can be both associative and pandiagonal is of the fifth order. There are 16 fifth-order squares that are both associative and pandiagonal, excluding rotations and reflections.

Embodiments of the present invention can be constructed such that the selection sequence within the cell array is in accordance with any suitable magic square of the appropriate order, whether or not the square is pandiagonal and/or associative.

In addition, it is not absolutely critical for the squares to be true "magic squares" in the sense that all of the rows, columns and the two diagonals add up to exactly the same value. Take, for example, the non-magic square of order 3 shown in FIG. 14(A). This is formed by juxtaposing the numbers 7 and 5 in the magic square of FIG. 8. In this case, the numbers in rows 1 to 3 and column 1 each sum to 15 (as in the magic square of FIG. 8) but the sums for columns 2 and 3 and the two diagonals deviate slightly from the "normal" value 15, and have the values 13 and 17. However, such an approximation to a magic square still provides worthwhile advantages in accordance with the present invention since the sums in the different rows, columns and the two diagonals are approximately the same. Any arrangement which reduces the deviation between the sums in the rows, columns and diagonals is advantageous for the purposes of the present invention.

Figures 14A, 14B, 15:
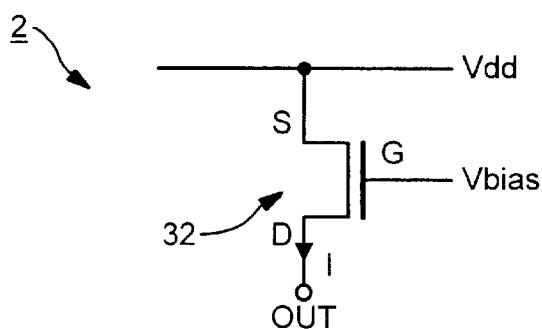
FIG. 14(A) shows an example of a further 3×3 square.
FIG. 14(B) shows an example of a 3×2 rectangular array.
FIG. 15 shows an example of the constitution of one of the cells of the FIG. 5 cell array circuitry.

It is also possible to apply the same principle to rectangular (non-square) arrays. For example, FIG. 14(B) shows a rectangular array having 2 rows and 3 columns. In this case, the sums for columns 1 to 3 have the same value 7 whereas the sums for rows 1 and 2 are as close as possible, at 10 and 11 respectively. Note that because the columns have less cells than the rows in this case, it is not possible to equalise the sums for rows and columns. Instead, it is sufficient to seek to minimise the deviation between the different rows (in this case 1) and to minimise the deviation between the different columns (in this case 0).

In the cell array 22 shown in FIG. 5, each cell is constituted by a current source 2. An example of the constitution of such a current source is shown in FIG. 15. In FIG. 15, the current source 2 comprises a PMOS field-effect transistor 32 having its source connected to a positive power supply line Vdd, its gate connected to receive a predetermined bias potential Vbias and its drain connected to an output node OUT of the current source. The predetermined bias potential Vbias has a constant potential difference from the positive power supply potential Vdd, for example. Accordingly, the transistor 32 is permanently turned on and supplies a substantially constant current I to its output node OUT.

Of course, each cell 2 in FIG. 5 could comprise a current sink circuit in place of the current source circuit 2. In this case, in a FET implementation the transistor 32 shown in FIG. 15 is changed to an NMOS FET and the source of the transistor is connected to a negative supply line potential such as Vss. In this case, Vbias is a predetermined reference potential above Vss, for example having a constant potential difference from Vss.

Alternatively, either the current source or the current sink can be implemented by using bipolar transistors.

It is possible to use several transistors in parallel to make up the current source or current sink, so as to increase the current capacity of the circuit. For example, it is possible to use four transistors connected in parallel.

It is not necessary for the cells in cell array circuitry embodying the present invention to contain current sources or current sinks.

Figure 16:
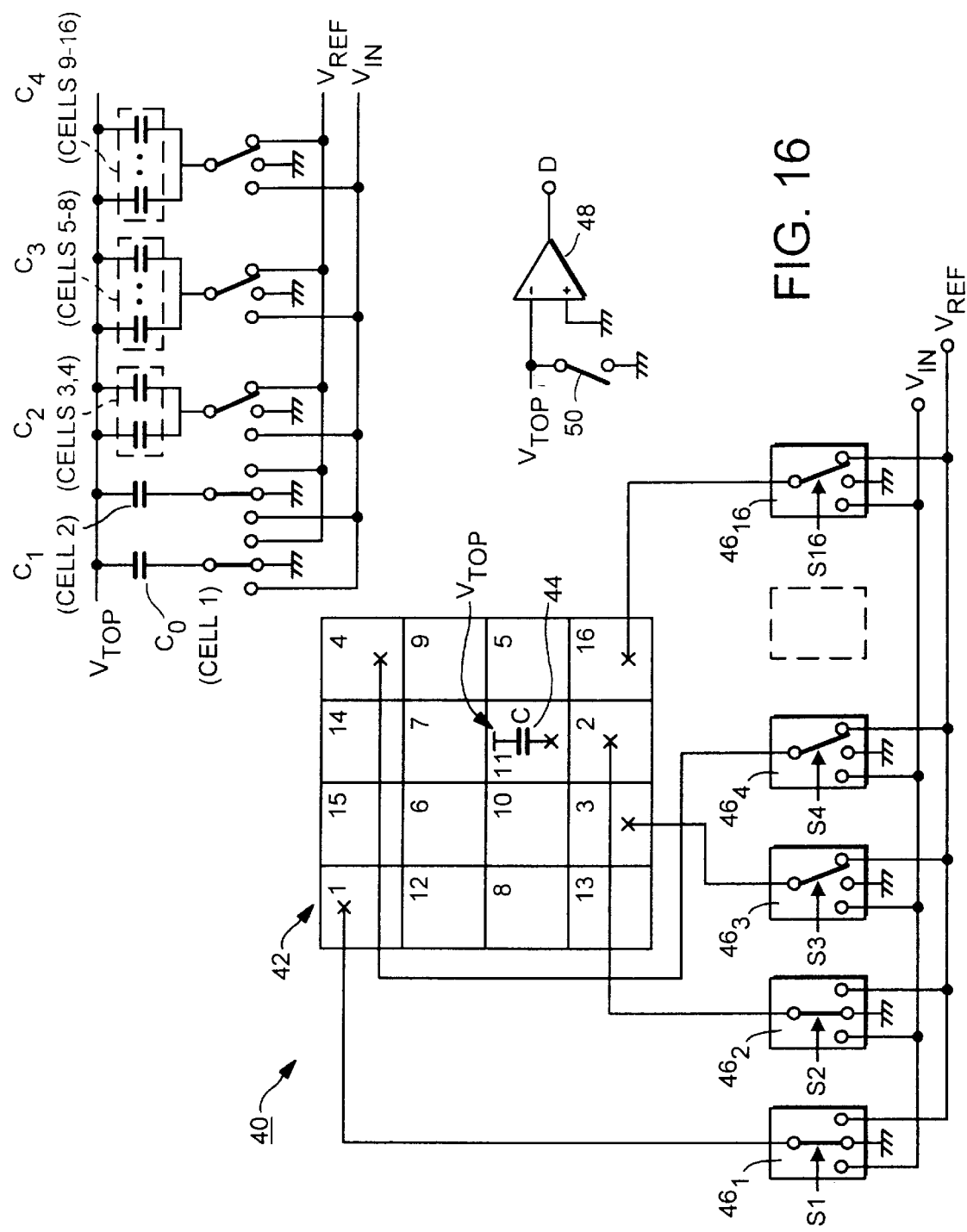
FIG. 16 shows parts of cell array circuitry according to a second embodiment of the present invention.

For example, in another embodiment of the present invention shown in FIG. 16, respective capacitance elements C are included in the different cells 44 of a cell array 42. Each cell 44 has an individually-corresponding switch circuit $46_1$ to $46_{16}$. An input node of each switch circuit 46 is connected to an output node (denoted by a cross in FIG. 16) of its corresponding cell 44. This output node is connected to a bottom plate of the capacitance element C in the cell.

In this embodiment, each switch circuit has three terminals, the respective first terminals being connected in common to receive an input voltage $V_{IN}$, the respective second terminals being connected in common to a negative reference voltage Vss, and the respective third terminals being connected in common to receive a predetermined reference potential $V_{REF}$. Each switch circuit 46 is controllable, in dependence upon a selection signal S applied thereto, to connect its input node to one of its first, second and third terminals.

The respective top plates of the capacitance elements C in the different cells are connected in common to a first input of a comparator 48. This first input is also connected via a switch element 50 to Vss. A second input of the comparator 48 is connected to Vss. A digital output signal D is produced at the output of the comparator 48.

The cell array circuitry shown in FIG. 16 is suitable for use in a successive-approximation analog-to-digital converter (ADC) which operates in accordance with the so-called "charge redistribution" principle. Such a successive-approximation ADC employs a digital-to-analog converter (DAC) incorporating binary-weighted capacitors. Further information on this type of capacitor DAC can be found, for example, in IEEE Journal of Solid State Circuits, Vo. Sc-14, pp.920–926, December 1979.

In the FIG. 16 embodiment, five such binary-weighted capacitors $C_0$ to $C_4$ are provided by the capacitance elements C in the different cells, as shown in the top right-hand corner of FIG. 16. The capacitor $C_0$ is provided by the capacitance element C of cell 1 alone. The capacitor $C_1$ is provided by the capacitance element C of cell 2 alone. The capacitor $C_2$ is provided by the respective capacitance elements C of cells 3 and 4 connected in parallel. The capacitor $C_3$ is provided by the respective capacitance elements C of cells 5 to 8 connected in parallel. The capacitor $C_4$ is provided by the respective capacitance elements C of cells 9 to 16 connected in parallel. The capacitance ratios of the capacitors $C_0$ to $C_4$ are therefore 1:1:2:4:8.

The cell array circuitry 40 in FIG. 16 operates as follows. Firstly, in a sampling mode of the circuitry, the top plates of all of the capacitors $C_0$ to $C_4$ are connected to Vss using the switch element 50, and all the bottom plates are connected to receive the input voltage $V_{IN}$ by controlling the switch circuits $46_1$ to $46_{16}$ so that all of them select their respective first terminals.

Next, the switch element 50 is turned off and all of the bottom plates are connected to Vss, so that the top-plate voltage $V_{TOP}$ becomes equal to the negative of the sampled input voltage $V_{IN}$, i.e. $V_{TOP}=-V_{IN}$.

The analog-to-digital conversion process then commences. In this process it is identified which of the capacitors $C_1$ to $C_4$ need to have their bottom plates changed from Vss potential to $V_{REF}$ potential in order for the top plate voltage $V_{TOP}$ to become 0. This determination is made according to a binary search algorithm.

For example, in a first step of the binary search algorithm, used to determine the most significant bit of the digital output word, the bottom plate of $C_4$ is switched from Vss to $V_{REF}$ so that the top plate voltage $V_{TOP}$ increases by an amount equal to ½ $V_{REF}$. This is accomplished by causing the switch circuits $46_9$ to $46_{16}$, corresponding to cells 9 to 16 whose respective capacitance elements make up the capacitor $C_4$, to operate in parallel to change their selections from the second terminal (connected to Vss) to the third terminal (connected to $V_{REF}$). The output D of the comparator 48 indicates the polarity of the difference between the top plate voltage $V_{TOP}$ and Vss, which in turn determines the value of the most significant bit of the digital output word.

The remaining bits of the digital output word are determined iteratively in a similar manner.

Figure 17:
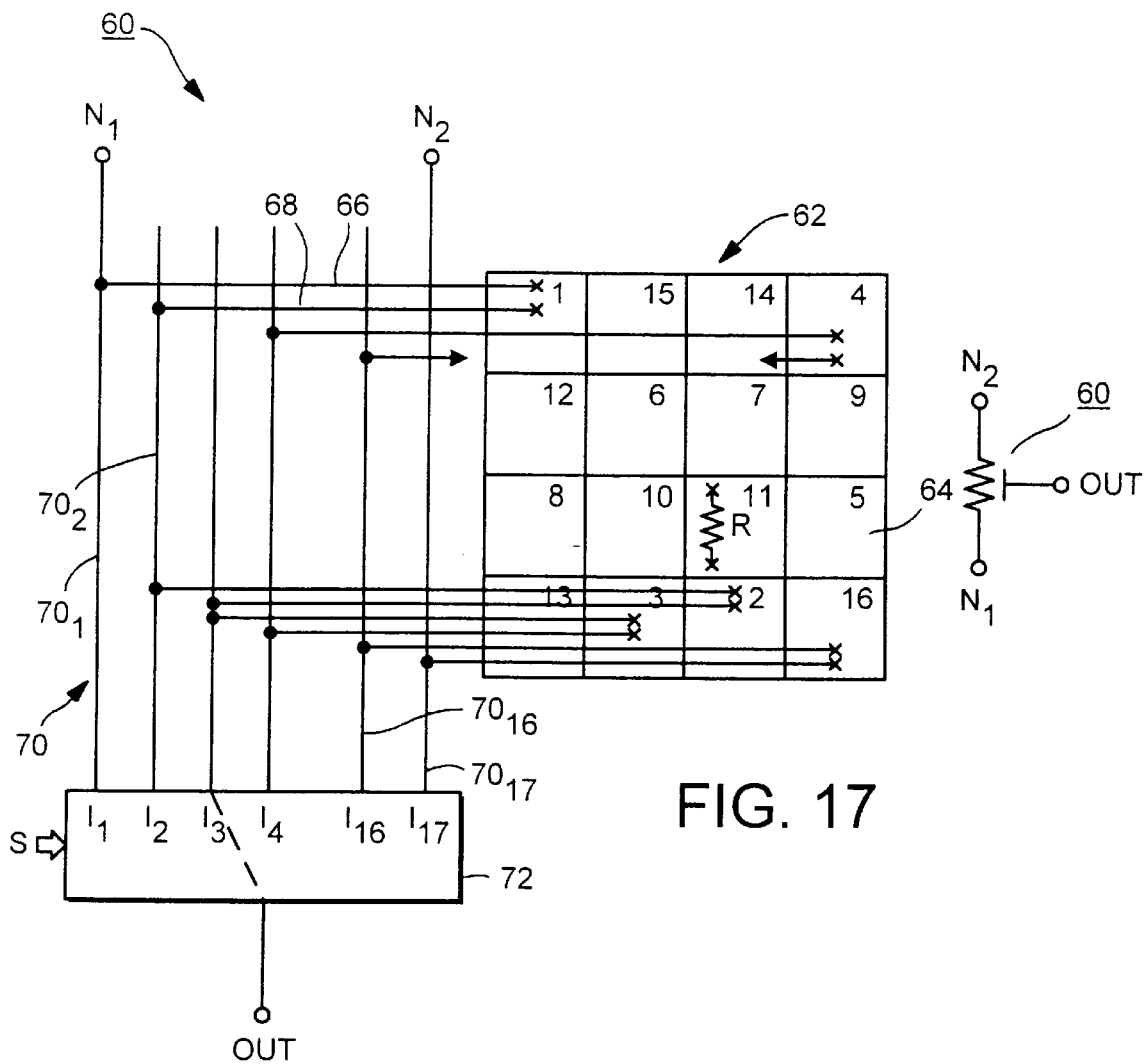
FIG. 17 shows parts of cell array circuitry according to a third embodiment of the present invention.

FIG. 17 shows yet another embodiment of the present invention in which cell array circuitry 60 includes a cell array 62 made up of individual cells 64, each containing a resistance element R. In this embodiment, a bus 70 is used to make connections between the different cells 64 and a selector circuit 72. The selector circuit 72 has inputs $I_1$ to $I_{17}$ connected to respective bus lines $70_1$ to $70_{17}$ of the bus 70. The first and last bus lines $70_1$ and $70_{17}$ are connected respectively to nodes $N_1$ and $N_2$ of the cell array circuitry. The resistance element R of each cell 64 is connected in series, via connection lines 66 and 68, between a pair of mutually-adjacent bus lines. For example, the resistance element R of cell 1 is connected in series between the bus lines $70_1$ and $70_2$.

The selector circuit 72 is selectively controllable, in accordance with a digital selection word S applied thereto, to make a connection between one of its inputs $I_1$ to $I_{17}$ and an output O thereof which is connected to an output node OUT of the cell array circuitry 60. For example, when, as shown in FIG. 17 itself, the selector circuit 72 connects its input $I_3$ to its output O, the number of resistance elements R connected in series between the first node $N_1$ of the circuitry and the output node OUT of the circuitry is two (the resistance elements in cells 1 and 2), and the number of resistance elements connected between the nodes $N_2$ and OUT is 14 (the resistance elements in cells 3 to 16 inclusive).

It will be appreciated that, as shown on the right-hand side of FIG. 17, the cell array circuitry in this embodiment functions as a digitally-controllable potentiometer, the position of the output tap being determined by the value of the digital selection word S. For example, the nodes $N_1$ and $N_2$ may be connected to first and second power supply lines Vdd and Vss respectively. If desired, a constant-current generator may be interposed between, on the one hand, one of the nodes $N_1$ and $N_2$, and, on the other hand, the power supply line to which the node is connected.

Figure 18:
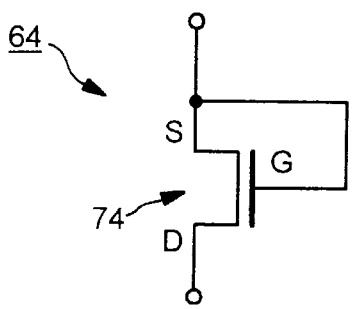
FIG. 18 shows an example of the constitution of one of the cells of the FIG. 17 cell array circuitry.

The resistance element R in each cell in FIG. 11 can be formed, for example, by a depletion-type MOSFET 74 as shown in FIG. 18. Several such transistors can be connected in parallel if higher current capacity is required.

It will be appreciated that in the first embodiment described with reference to FIG. 5, the quantities being summed as the cells are selected sequentially are currents. In the second embodiment described with reference to FIG. 16 the quantities being summed are charges. In the third embodiment described with reference to FIG. 17, the quantities being summed are resistances. However, the present invention is not restricted to summing these three quantities. Any suitable analog quantities can be summed in cell array circuitry embodying the present invention. Thus, the invention is applicable advantageously in any situation in which respective analog quantities produced by, or associated with, nominally-matched cells must be accumulated or summed in some way.

Although not shown in the embodiments described with reference to FIGS. 5, 16 and 17, it is possible for the cells to incorporate their respective associated switch circuits as well as parts of any decoding circuitry, if desired. However, in order to minimise the size of the individual cells, and thereby enable the cells to be in close physical proximity with one another (so as to equalise their operating conditions), it is normally preferable for the switch circuits and decoding circuitry to be external to the cells.

A fourth embodiment of the present invention will now be described with reference to FIG. 19. In this embodiment, in accordance with a further aspect of the present invention, four rectangular (or square) cell arrays are placed in a predetermined arrangement, again for the purpose of minimising the effects of fabrication errors on the summed analog quantities to be produced.

Figure 19:
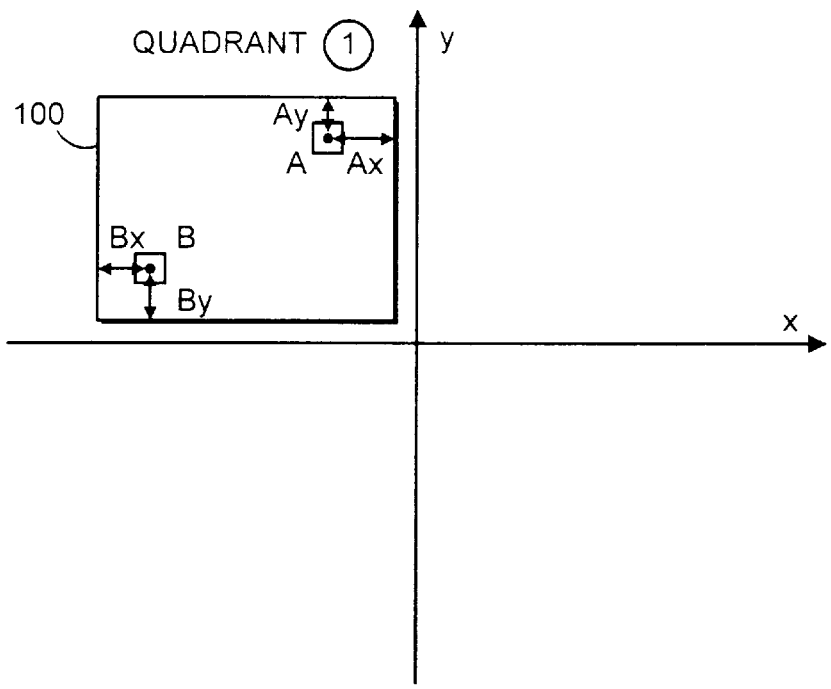
FIGS. 19 to 22 show schematic diagrams for use in explaining a principle underlying cell array circuitry embodying a second aspect of the present invention.

Referring firstly to FIG. 19, a first cell array 100, made up of a plurality of individual cells arrayed in rows and columns, is placed in a first quadrant. Two representative cells A1 and B1 of the array 100 are shown in FIG. 19, the cell A1 being spaced by distances Ax and Ay from the nearest edges in the x and y directions respectively, and the cell B1 being spaced from its nearest edges by distances Bx and By in the x and y directions respectively.

Figure 20:
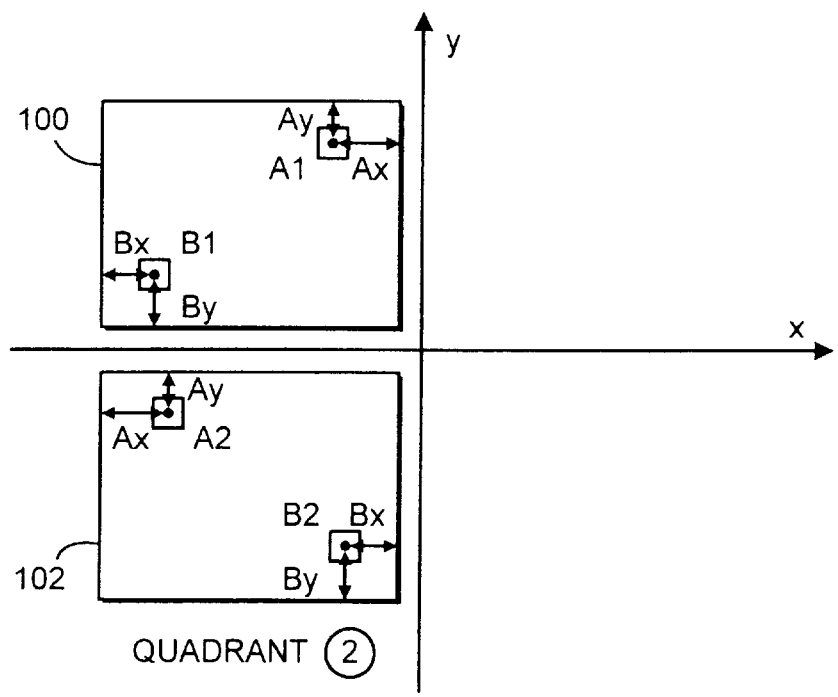

Then, as shown in FIG. 20, a second cell array 102 is placed in a second quadrant. The arrangement of cells in the second cell array 102 is produced by reflecting the first cell array 100 about the y axis and then translating (moving) the resulting reflection into the second quadrant. Thus, representative cells A2 and B2 of the second cell array 102, which correspond respectively to the representative cells A1 and B1 of the first cell array 100, are located as shown in FIG. 20.

Figure 21:
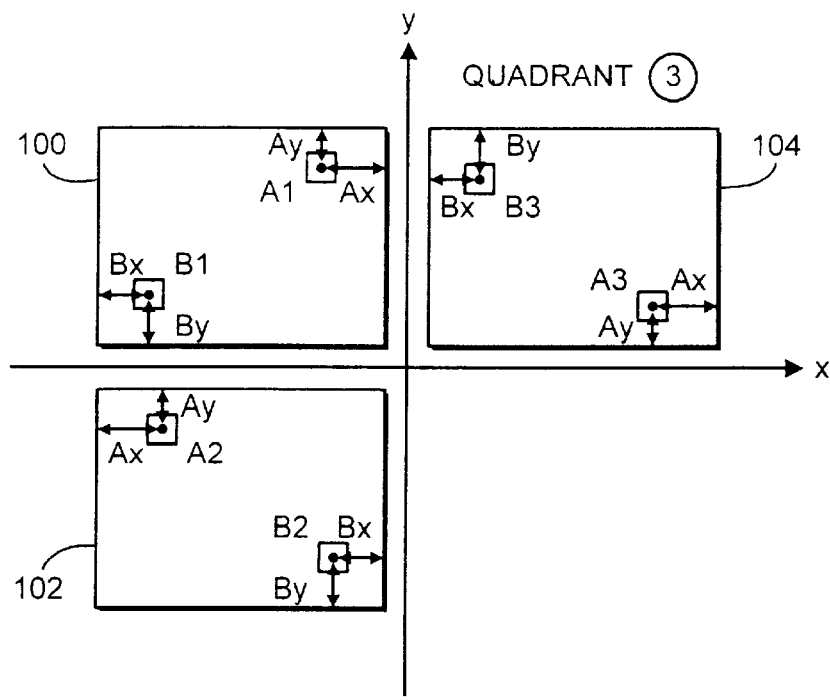

Next, as shown in FIG. 21, a third cell array 104 is placed in a third quadrant. The arrangement of cells in the third cell array 104 is produced by reflecting the first cell array 100 about the x axis and then shifting the resulting reflection into the third quadrant. Representative cells A3 and B3, corresponding respectively to the representative cells A1 and B1 of the cell array 100, are shown in FIG. 21.

Figure 22:
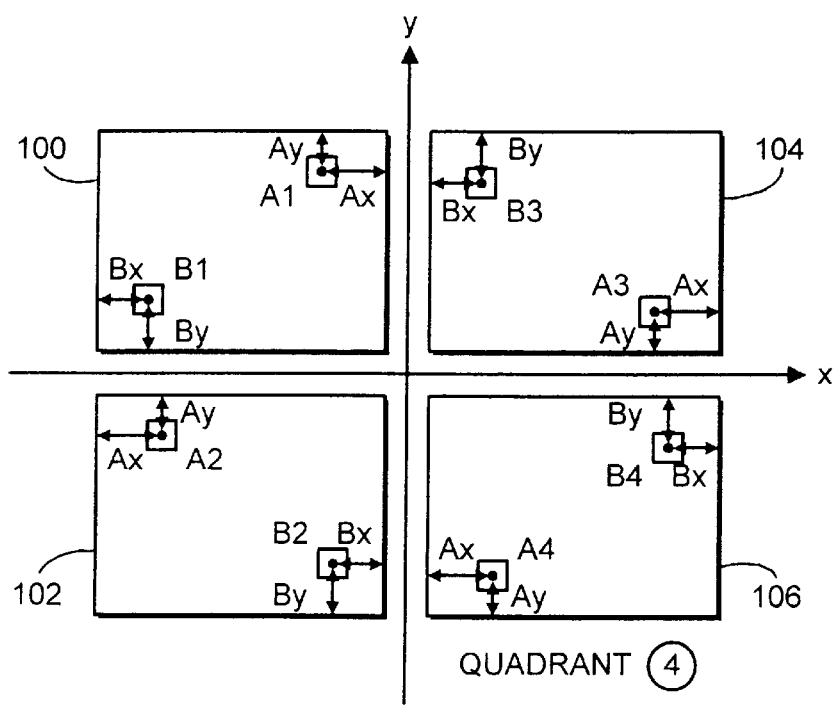

Finally, as shown in FIG. 22, a fourth cell array 106 is placed in a fourth quadrant. The arrangement of the cells in the fourth cell array 106 is produced by rotating the first cell array 100 through 180° about the origin. Representative cells A4 and B4, corresponding respectively to the representative cells A1 and B1 of the first cell array 100, are shown in FIG. 22.

The result of arranging the first, second, third and fourth cell arrays 100 to 106 in the configuration shown in FIG. 22 is that the corresponding representative cells of the four cell arrays have a common centroid at the origin. For example, considering the set of four representative cells A1 to A4, A1 and A4 are both spaced by the same distance Ax from the y axis on opposite sides thereof, and the cells A2 and A3 are also equidistant from the y axis on opposite sides thereof. Similarly, A1 and A4 are equidistant from the x axis on opposite sides thereof, as are the cells A2 and A3.

Thus, any graded errors in the x-direction attributable to A1 and A4 cancel one another out. Any graded x-direction errors attributable to A2 and A3 also cancel one another out. The same is true for y-direction graded errors.

However, it will also be seen that in the y-direction, A1 is spaced from the top edge of the area occupied by the four cell arrays 100–106 by the same distance Ay as A2 is spaced from the centreline of the area in the y-direction (that is from the x axis). Any symmetrical y-direction errors attributable to A1 and A2 therefore cancel one another out. The same is true for A3 and A4 in the y-direction, and for A1 and A3 and for A2 and A4 in the x-direction.

The same is true for every other set of corresponding cells of the four arrays.

The selection sequence of the cells within the first cell array 100 (which in turn determines the respective selection sequences within the other cell arrays 102, 104 and 106 derived from the first cell array 100) is not critical. For example, it would be possible simply to select the cells in a conventional selection sequence as shown in FIG. 3 (i.e. columns of row 1, followed by columns of row 2, and so on). However, preferably, the selection sequence within the first cell array 100 is determined in accordance with the principles underlying the aforesaid first aspect of the invention, as described previously with reference to FIGS. 5 to 14(B). In this case, graded, symmetrical and other errors within each individual cell array can be compensated as well as the errors present across the area occupied by the four cell arrays as a whole.

Figure 23:
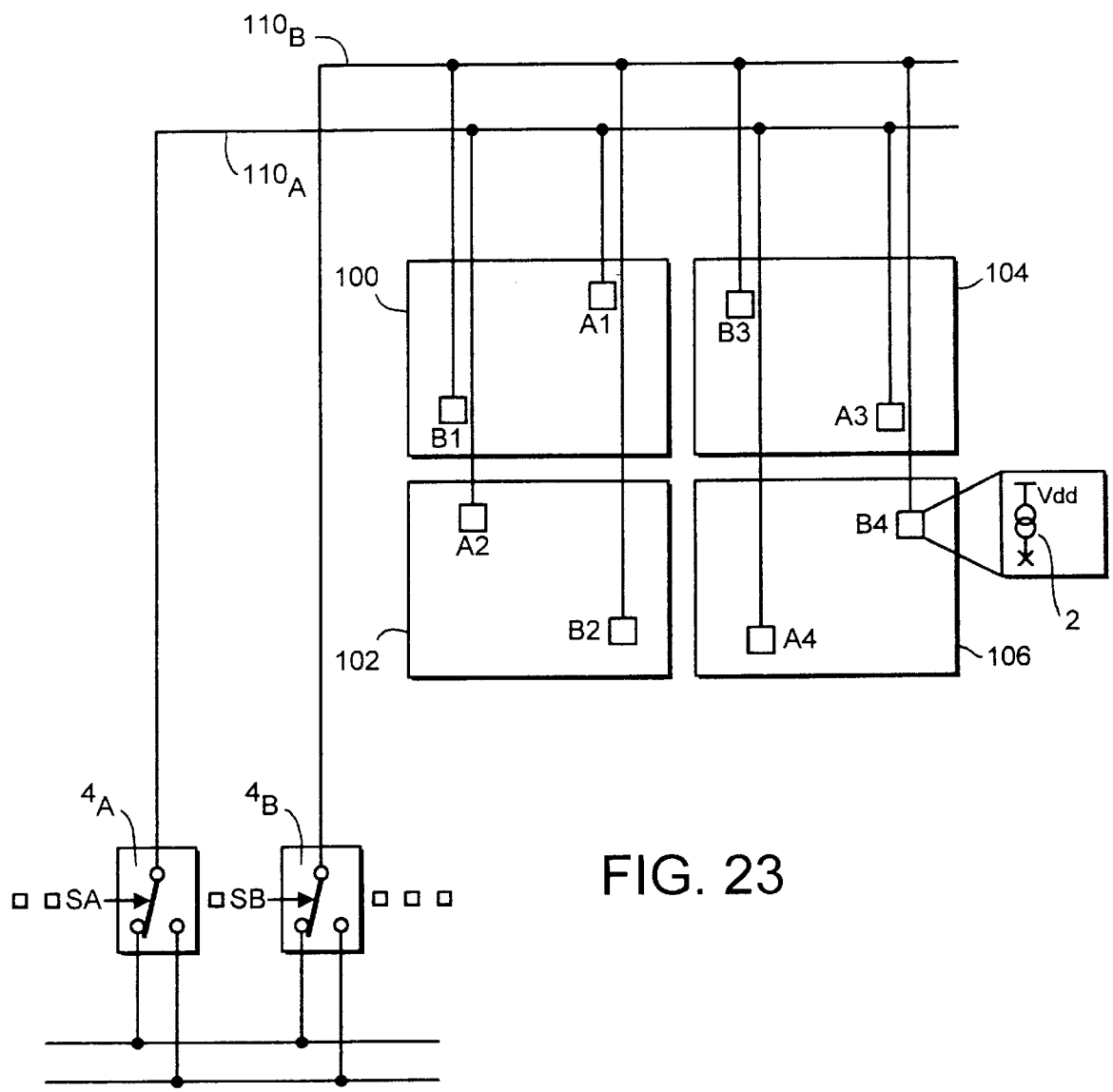
FIG. 23 shows cell array circuitry according to a fourth embodiment of the present invention.

FIG. 23 shows an example of the way in which the four different cells belonging to each set of cells can be connected together and selected. As shown in FIG. 23, each set of four corresponding cells has an individually-corresponding switch circuit 4. For example, the set of four cells A1 to A4 has an individually-corresponding switch circuit $4_A$.

In this example, the cells are constituted by respective constant-current sources 2 and the four cells of a set are connected to a common connection line 110 that is connected to an input of the corresponding switch circuit.

As described previously with reference to FIG. 15, each cell may be constituted by a single transistor or by plural transistors connected in parallel. For example, each cell may comprise four parallel-connected p-type FETs.

As described previously with reference to FIGS. 16 and 17, the cells in the four cell arrays of FIG. 23 need not comprise constant-current sources. They could alternatively comprise constant-current sink circuits. Furthermore, they could comprise capacitance elements C as shown in FIG. 16, or resistance elements R as shown in FIG. 17. In this case, the connections from the cells to the switch circuits should be modified in accordance with FIGS. 16 and 17, as appropriate.

Worthwhile advantages in accordance with the second aspect of the present invention can be obtained using just two cell arrays, depending upon the combination of errors present in the area occupied by the two cell arrays. Take for example just the two cell arrays 100 and 102 of FIG. 22 used without the arrays 104 and 106. In this case, a graded error in the x-direction is cancelled out and a symmetrical error in the y-direction is cancelled out. Similarly, take for example just the two cell arrays 100 and 104 of FIG. 22 used without the arrays 102 and 106. In this case, a symmetrical error in the x-direction is cancelled out and a graded error in the y-direction is cancelled out.

Another useful embodiment can be made using just the two cell arrays 100 and 106 of FIG. 22 and placing them in quadrants 1 and 2 respectively. In this case, graded errors in both the x- and y-directions are cancelled out. The same effect can be achieved by using the cell arrays 100 and 106 only and placing them in quadrants 1 and 3 respectively.

Figure 24:
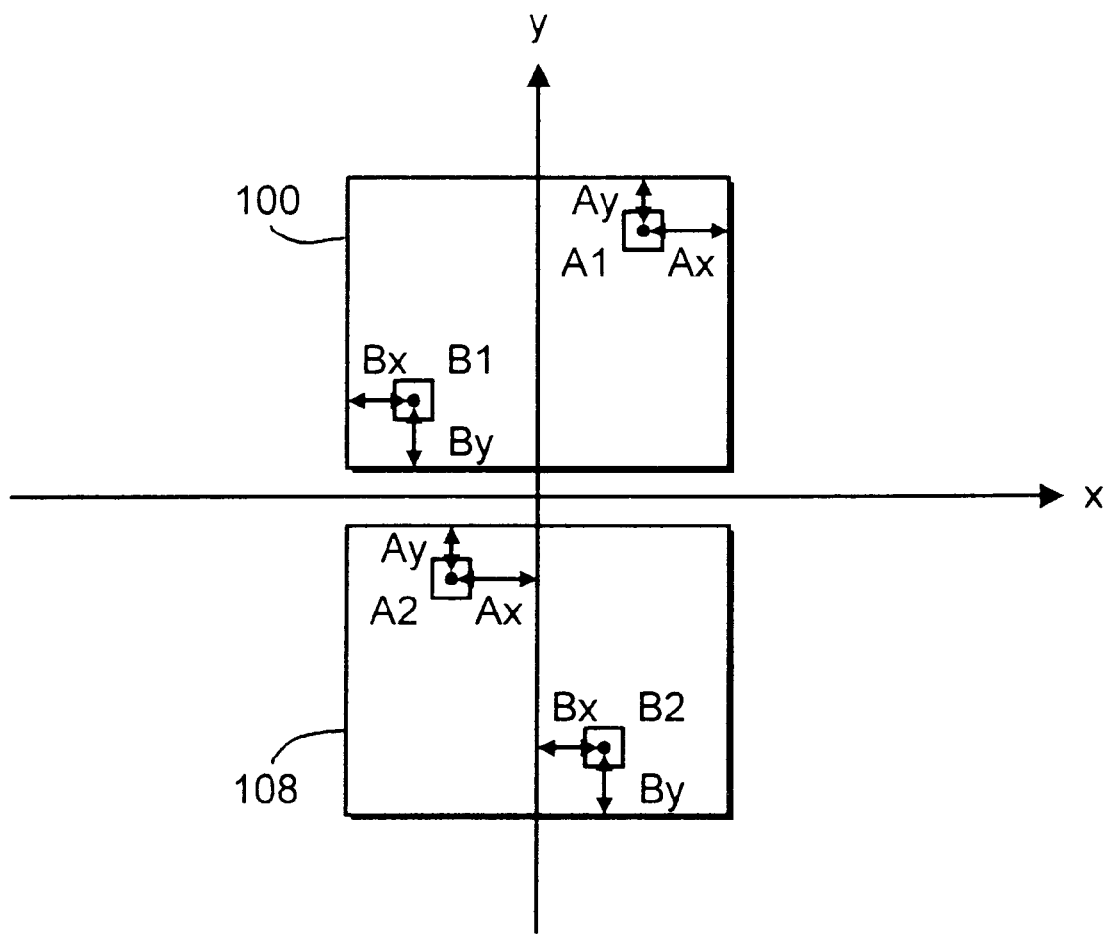
FIG. 24 shows cell array circuitry according to a fifth embodiment of the present invention.

FIG. 24 shows another embodiment in which a first cell array 100 is split equally across quadrants 1 and 3. The portion in quadrant 1 is copied to quadrant 4 without rotating or reflecting it and the portion in quadrant 3 is copied to quadrant 2 without rotating or reflecting it. In the result, symmetrical errors in both the x- and y-directions are cancelled out.

Another possibility is to place four identical cell arrays 100 in quadrant 1 to 4 respectively. This has the effect of cancelling out symmetrical errors in both the x- and y-directions.

It is not necessary for the cell arrays to be placed directly adjacent to one another in embodiments of the second aspect of the present invention. For example, in the FIG. 22 embodiment the arrays 100 and 102 could be spaced apart in the x-direction from the arrays 104 and 106 so as to leave a space in which to place further circuitry such as other cells of the DAC.

What is claimed is:

1. Cell array circuitry including:
   a cell array comprising a plurality of mutually-corresponding cells arranged in rows and columns, each cell including a circuit which defines a respective analog quantity;
   a selection circuit which assigns the cells of the array respective ordinal positions in a predetermined selection sequence and which selects the cells in accordance with their respective assigned ordinal positions, the assigned ordinal positions of said cells being such as to tend to equalise respective sequence-position sums for different rows of the array and/or to tend to equalise respective sequence-position sums for different columns of the array, where the sequence-position sum for a row or column is determined by summing the respective ordinal positions of the cells in the row or column concerned; and
   an accumulation circuit which accumulates respective analog quantities defined by the selected cells.

2. Cell array circuitry as claimed in claim 1, wherein said cells are assigned ordinal positions such as to tend to equalise the respective sequence-position sums for all rows of the array and/or to tend to equalise the respective sequence-position sums for all columns of the array.

3. Cell array circuitry as claimed in claim 2, wherein the cell array has equal numbers of rows and columns, and said cells are assigned ordinal positions such as to tend to equalise the respective sequence-position sums for all rows and columns of the array.

4. Cell array circuitry as claimed in claim 3, wherein the distribution of said assigned ordinal positions within the array conforms to the distribution of integers in a magic square of order equal to the number of rows or columns of the array.

5. Cell array circuitry as claimed in claim 4, wherein said magic square is pandiagonal.

6. Cell array circuitry as claimed in claim 4, wherein said magic square is associative.

7. Cell array circuitry as claimed in claim 2, wherein the cell array has different numbers of rows and columns, and said assigned ordinal positions are such as to tend to equalise the respective sequence-position sums for all rows and to tend to equalise the respective sequence-position sums for all columns.

8. Cell array circuitry as claimed in claim 1, wherein each cell includes a current source or current sink circuit, and the accumulation circuit accumulates the respective currents sourced, or sunk as the case may be, by the current source/sink circuits of the selected cells.

9. Cell array circuitry as claimed in claim 1, wherein each cell includes a capacitance element, and the accumulation circuit accumulates respective charges stored by the capacitance elements of the selected cells.

10. Cell array circuitry as claimed in claim 1, wherein each cell includes a resistance element, and the accumulation circuit accumulates respective resistances of the resistance elements of the selected cells.

11. Cell array circuitry as claimed in claim 1, wherein said selection circuit is operable to select together each cell of the array whose said assigned ordinal position is less than a given value.

12. Cell array circuitry as claimed in claim 11, wherein said given value is determined by a selection signal applied to said selection circuit.

13. Cell array circuitry as claimed in claim 1, wherein said selection circuit is operable to select the cells of the array in at least first and second binary-weighted groups, the number of cells in the first group being double the number of cells in the second group.

14. Cell array circuitry as claimed in claim 13, wherein in at least said first group the cells in the group have consecutive assigned ordinal positions.

15. Cell array circuitry including:
   respective first, second, third and fourth cell arrays, each cell array being made up of a plurality of mutually-corresponding cells arranged in rows and columns and each of said second, third and fourth cell arrays being placed in a predetermined spatial relationship with respect to the first cell array, each cell including a circuit which defines a respective analog quantity;

a cell set selection circuit which selects the cells of the arrays in sets, each such cell set including a first cell from the first cell array and also including a second cell from the second cell array, which second cell corresponds individually to the first cell of the cell set concerned, and also including a third cell from the third cell array, which third cell corresponds individually to the first cell of the cell set concerned, and a fourth cell from the fourth cell array, which fourth cell corresponds individually to the first cell of the cell set concerned;

the physical arrangement of such second cells within the second cell array corresponding to a predetermined transformation of the physical arrangement of their respective corresponding first cells within the first cell array, and the physical arrangement of such third cells within the third cell array corresponding to a predetermined transformation of the physical arrangement of their respective corresponding first cells within the first cell array and the physical arrangement of such fourth cells within the fourth cell array corresponding to a predetermined transformation of the physical arrangement of their respective corresponding first cells within the first cell array; and an accumulation circuit which accumulates respective analog quantities defined by the first, second, third and fourth cells of a selected cell set.

le;.5q16. Cell array circuitry as claimed in claim 15, wherein an area containing the four cell arrays is divided into four quadrants by respective first and second mutually-perpendicular axes that intersect at an origin point of the area, the first, second, third and fourth cell arrays being arranged respectively in the four quadrants.

le;.5q17. Cell array circuitry as claimed in claim 16, wherein:

first and second ones of the quadrants are on the same side of said second axis, and said first quadrant and a third one of the quadrants are on the same side of the first axis;

the first cell array is located in said first quadrant;

the second cell array corresponds to a reflection about said second axis of said first cell array, which reflection is located in said second quadrant;

the third cell array corresponds to a reflection about said first axis of said first cell array, which reflection is located in said third quadrant; and the fourth cell array corresponds to a rotation through 180° of said first cell array, which rotation is located in said fourth quadrant.

le;.5q18. Cell array circuitry as claimed in claim 15, wherein said cell set selection circuit is operable to assign the cells of each cell array respective ordinal positions in a predetermined selection sequence and to select the cells in accordance with their respective assigned ordinal positions, and said accumulation circuit is operable to accumulate respective analog quantities defined by the cells of the selected cell sets.

le;.5q19. Cell array circuitry as claimed in claim 18, wherein for each cell array the assigned ordinal positions conform to the physical order of the cells in the cell array concerned.

le;.5q20. Cell array circuitry as claimed in claim 18, wherein for each cell array said assigned ordinal positions are such as to tend to equalise the respective sequence-position sums for different rows of the array concerned and/or to tend to equalise the respective sequence-position sums for different columns of the array concerned, where the sequence-position sum for a row or column is determined by summing the respective ordinal positions of the cells in the row or column concerned.

le;.5q21. Cell array circuitry as claimed in claim 20, wherein said assigned ordinal positions are such as to tend to equalise the respective sequence-position sums for all rows of the array and/or to tend to equalise the respective sequence-position sums for all columns of the array.

le;.5q22. Cell array circuitry as claimed in claim 21, wherein the cell array has equal numbers of rows and columns, and said assigned ordinal positions are such as to tend to equalise the respective sequence-position sums for all rows and columns of the array.

le;.5q23. Cell array circuitry as claimed in claim 22, wherein the distribution of said assigned ordinal positions within the array conforms to the distribution of integers in a magic square of order equal to the number of rows or columns of the array.

le;.5q24. Cell array circuitry as claimed in claim 21, wherein the cell array has different numbers of rows and columns, and said assigned ordinal positions are such as to tend to equalise the respective sequence-position sums for all rows and to tend to equalise the respective sequence-position sums for all columns.

le;.5q25. Cell array circuitry as claimed in claim 15, wherein each cell includes a current source of current sink circuit, and the accumulation circuit is operable to accumulate respective currents sourced, or sunk as the case may be, by the current source/sink circuits of the selected cells.

le;.5q26. Cell array circuitry as claimed in claim 15, wherein each cell includes a capacitance element, and the accumulation circuit is operable to accumulate respective charges stored by the capacitance elements of the selected cells.

le;.5q27. Cell array circuitry as claimed in claim 15, wherein each cell includes a resistance element, and the accumulation circuit is operable to accumulate respective resistances of the resistance elements of the selected cells.

le;.5q28. Cell array circuitry as claimed in claim 15, wherein for each cell array said cell set selection circuit is operable to select together each cell of the array whose said assigned ordinal position is less than a given value.

le;.5q29. Cell array circuitry as claimed in claim 28, wherein said given value is determined by a selection signal applied to said cell set selection circuit.

le;.5q30. Cell array circuitry as claimed in claim 15, wherein said cell set selection circuit is operable to select the cells of each cell array in at least first and second binary-weighted groups, the number of cells in the first group being double the number of cells in the second group.

le;.5q31. Cell array circuitry as claimed in claim 30, wherein in at least said first group the cells in the group have consecutive assigned ordinal positions.

le;.5q32. A digital-to-analog converter including cell array circuitry as claimed in claim 1.

le;.5q33. An analog-to-digital converter including cell array circuitry as claimed in claim 1.

le;.5q34. A digital-to-analog converter including cell array circuitry as claimed in claim 15.

le;.5q35. An analog-to-digital converter including cell array circuitry as claimed in claim 15.

36. Cell array circuitry including:

respective first and second cell arrays, each cell array being made up of a plurality of mutually-corresponding cells arranged in rows and columns, each cell including a circuit which defines a respective analog quantity, the second cell array being placed in a predetermined spatial relationship with respect to the first cell array, wherein in each cell array the cells are assigned respective ordinal positions in a predetermined selection sequence, which assigned ordinal positions are such as to tend to equalize the respective sequence-position sums for different rows of the array concerned and/or to tend to equalize the respective sequence-position sums for different columns of the array concerned, where the sequence-position sum for a row or column is determined by summing the respective ordinal positions of the cells in the row or column concerned;

a cell set selection circuit which selects the cells of the arrays in sets, each such cell set including a first cell from the first cell array, selected in accordance with its said assigned ordinal position in said first cell array, and an individually-corresponding second cell from the second cell array, selected in accordance with its said assigned ordinal position in said second cell array, and the physical arrangement of such second cells within the second cell array corresponding to a predetermined transformation of the physical arrangement of their respective corresponding first cells within the first cell array; and an accumulation circuit which accumulates respective analog quantities defined by the cells of the selected cell sets.

37. Cell array circuitry as claimed in claim 36, wherein for each cell array said cell set selection circuit is operable to select together each cell of the array whose said assigned ordinal position is less than a given value.

38. Cell array circuitry including:

respective first and second cell arrays, each cell array being made up of a plurality of mutually-corresponding cells arranged in rows and columns, each cell in the array defining a respective analog quantity, the second cell array being placed in a predetermined spatial relationship with respect to the first cell array, wherein the first and second cell arrays are spaced apart in a first direction, and a centreline of the second cell array that extends centrally through the array in the first direction is aligned with a centreline of the first cell array that extends centrally through the array in the first direction;

cell set selection circuitry which selects the cells of the arrays in sets, each such cell set including a first cell from the first cell array and an individually-corresponding second cell from the second cell array, the physical arrangement of such second cells within the second cell array corresponding to a predetermined transformation of the physical arrangement of their respective corresponding first cells within the first cell array, which predetermined transformation involves a reflection of said first cell array about its said centreline, and an accumulation circuit which accumulates respective analog quantities defined by the first and second cells of the selected cell set.

39. Cell array circuitry including:

respective first and second cell arrays, each cell array being made up of a plurality of mutually-corresponding cells arranged in rows and columns, each cell including a circuit which defines a respective analog quantity, the second cell array being placed in a predetermined spatial relationship with respect to the first cell array, wherein the first and second cell arrays are spaced apart in a first direction, and a centreline of the second cell array that extends centrally through the array in the first direction is aligned with a centreline of the first cell array that extends centrally through the array in the first direction, and each cell array has a first half on one side of its said centreline and a second half on the other side of its said centreline;

a cell set selection circuit which selects the cells of the arrays in sets, each such cell set including a first cell from the first cell array and an individually-corresponding second cell from the second cell array, the physical arrangement of such second cells within the second cell array corresponding to a predetermined transformation of the physical arrangement of their respective corresponding first cells within the first cell array, which predetermined transformation involves copying the first half of the first cell array into the second half of the second cell array, and copying the second half of the first cell array into the first half of the second cell array; and an accumulation circuit which accumulates respective analog quantities defined by the first and second cells of a selected cell set.

\* \* \* \* \*

UNITED STATES PATENT AND TRADEMARK OFFICE
CERTIFICATE OF CORRECTION

PATENT NO. : 6,236,346 B1
DATED : May 22, 2001
INVENTOR(S) : William George John Schofield Page 1 of 1

It is certified that error appears in the above-identified patent and that said Letters Patent is hereby corrected as shown below:

Claims 1-39,
Before each of claims 1-39, delete "le;5q".

Column 18,
Line 32, change "of" to -- or --.

Signed and Sealed this

Twenty-ninth Day of January, 2002

Attest:

Attesting Officer

JAMES E. ROGAN
Director of the United States Patent and Trademark Office